United States Patent
Lim et al.

(10) Patent No.: US 11,397,217 B2
(45) Date of Patent: Jul. 26, 2022

(54) BATTERY CHARGING MANAGEMENT APPARATUS AND METHOD

(71) Applicant: LG CHEM, LTD., Seoul (KR)

(72) Inventors: Jin-Hyung Lim, Daejeon (KR); Du-Seong Yoon, Daejeon (KR); Won-Tae Joe, Daejeon (KR); Myung-Hwan Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 350 days.

(21) Appl. No.: 16/611,031

(22) PCT Filed: Nov. 9, 2018

(86) PCT No.: PCT/KR2018/013670
§ 371 (c)(1),
(2) Date: Nov. 5, 2019

(87) PCT Pub. No.: WO2019/124738
PCT Pub. Date: Jun. 27, 2019

(65) Prior Publication Data
US 2020/0182943 A1    Jun. 11, 2020

(30) Foreign Application Priority Data
Dec. 18, 2017 (KR) .......................... 10-2017-0174361

(51) Int. Cl.
*G01R 31/392* (2019.01)
*H01M 10/44* (2006.01)
(Continued)

(52) U.S. Cl.
CPC ............ *G01R 31/392* (2019.01); *B60L 58/13* (2019.02); *G01R 31/3828* (2019.01); *H01M 10/44* (2013.01); *H02J 7/0048* (2020.01)

(58) Field of Classification Search
None
See application file for complete search history.

(56) References Cited

U.S. PATENT DOCUMENTS

| | | |
|---|---|---|
| 2013/0066573 A1 | 3/2013 | Bond et al. |
| 2013/0138369 A1 | 5/2013 | Papana et al. |

(Continued)

FOREIGN PATENT DOCUMENTS

| | | |
|---|---|---|
| EP | 2 131 440 A1 | 12/2009 |
| EP | 2 760 102 A1 | 7/2014 |

(Continued)

OTHER PUBLICATIONS

International Search Report dated Feb. 18, 2019, issued in corresponding International Patent Application No. PCT/KR2018/013670.

(Continued)

*Primary Examiner* — Brent A. Fairbanks
(74) *Attorney, Agent, or Firm* — Morgan, Lewis & Bockius LLP (57) ABSTRACT

Disclosed is a technique capable of improving the life span of a battery by managing the charging of the battery. The battery charging management apparatus includes a degradation rate estimating unit configured to estimate a degradation rate of a secondary battery; a ceiling calculating unit configured to calculate a charge ceiling voltage based on the degradation rate estimated by the degradation rate estimating unit; a charge control unit configured to control the charging of the secondary battery so that the secondary battery is charged only up to the charge ceiling voltage calculated by the ceiling calculating unit; and a memory unit configured to store information required for operating at least one of the degradation rate estimating unit, the ceiling calculating unit and the charge control unit.

20 Claims, 5 Drawing Sheets

(51) Int. Cl.
*G01R 31/3828* (2019.01)
*B60L 58/13* (2019.01)
*H02J 7/00* (2006.01)

(56) References Cited

U.S. PATENT DOCUMENTS

| | | | |
|---|---|---|---|
| 2013/0314050 | A1 | 11/2013 | Matsubara et al. |
| 2015/0022157 | A1* | 1/2015 | Takahashi ............... H02J 7/007 320/134 |
| 2015/0268309 | A1 | 9/2015 | Kim |
| 2015/0357852 | A1* | 12/2015 | Nakao ..................... B60L 58/12 320/162 |
| 2016/0072313 | A1 | 3/2016 | Satou et al. |
| 2017/0033592 | A1 | 2/2017 | Yoon |
| 2017/0069938 | A1 | 3/2017 | Morita et al. |
| 2017/0205469 | A1 | 7/2017 | Song et al. |
| 2017/0294801 | A1 | 10/2017 | Kim et al. |
| 2018/0246172 | A1* | 8/2018 | Abe ..................... H01M 10/425 |

FOREIGN PATENT DOCUMENTS

| | | |
|---|---|---|
| JP | H05-284607 A | 10/1993 |
| JP | 2013-122450 A | 6/2013 |
| JP | 2013-187960 A | 9/2013 |
| JP | 2013247003 A | 12/2013 |
| JP | 2014-011826 A | 1/2014 |
| JP | 2016-054082 A | 4/2016 |
| JP | 2016-220279 A | 12/2016 |
| JP | 2017-034807 A | 2/2017 |
| JP | 2017-054696 A | 3/2017 |
| KR | 10-2007-0006953 A | 1/2007 |
| KR | 10-2014-0080635 A | 7/2014 |
| KR | 10-2015-0109643 A | 10/2015 |
| KR | 10-2017-0085365 A | 7/2017 |
| KR | 10-1786706 B1 | 10/2017 |
| WO | 2013/105140 A1 | 7/2013 |

OTHER PUBLICATIONS

Extended European Search Report dated May 6, 2020, issued in corresponding European Patent Application No. 18892307.2.

* cited by examiner

BATTERY CHARGING MANAGEMENT APPARATUS AND METHOD

TECHNICAL FIELD

The present application claims priority to Korean Patent Application No. 10-2017-0174361 filed on Dec. 18, 2017 in the Republic of Korea, the disclosures of which are incorporated herein by reference.

The present disclosure relates to a technique for managing a battery, and more particularly, to a technique capable of improving the life span of a battery by managing the charging of the battery.

BACKGROUND ART

Generally, a secondary battery is a battery capable of charging and discharging, unlike a non-rechargeable primary battery, and is widely used in electric vehicles and electronic devices such as mobile phones, notebook computers, drones, robots and the like. In particular, a lithium secondary battery has a higher capacity than nickel-cadmium batteries or nickel-hydrogen batteries and has a high energy density per unit weight. For this reason, the lithium secondary battery is utilized more and more.

The lithium secondary battery mainly uses lithium-based oxide and carbonaceous material as a positive electrode active material and a negative electrode active material, respectively. The lithium secondary battery includes an electrode assembly in which a positive electrode plate and a negative electrode plate respectively coated with a positive electrode active material and a negative electrode active material are disposed with a separator interposed therebetween, and an exterior for hermetically accommodating the electrode assembly together with an electrolyte.

The secondary battery generates electrical energy through electrochemical oxidation and reduction reactions. However, the capacity of the secondary battery at the time of initial manufacture, namely the capacity in the BOL (Beginning Of Life) state, is not maintained and decreases with time. In particular, if the secondary battery is used for a long time under certain conditions, the supply of power by the secondary battery may be suddenly stopped. In this case, a system equipped with the secondary battery is not able to perform its function, which may cause serious problems.

The power failure of the secondary battery may occur due to various causes, and a main cause is the reduction of solvent and salt, caused by the oxidation or reduction reaction between an electrolyte and an electrode. In particular, as the secondary battery degrades, a balance shift between a positive electrode and a negative electrode occurs, and the balance shift accelerates the reaction between the electrolyte and the electrode, thereby degrading the secondary battery more rapidly.

DISCLOSURE

Technical Problem

The present disclosure is designed to solve the problems of the related art, and therefore the present disclosure is directed to providing a secondary battery charging management apparatus and method, which may delay degradation of the secondary battery by reducing the reaction between an electrolyte and an electrode.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery charging management apparatus, comprising: a degradation rate estimating unit configured to estimate a degradation rate of a secondary battery; a ceiling calculating unit configured to calculate a charge ceiling voltage based on the degradation rate estimated by the degradation rate estimating unit; a charge control unit configured to control the charging of the secondary battery so that the secondary battery is charged only up to the charge ceiling voltage calculated by the ceiling calculating unit; and a memory unit configured to store information required for operating at least one of the degradation rate estimating unit, the ceiling calculating unit and the charge control unit. The term "degradation rate" of a battery, as used in this application, refers to a degradation degree, ratio, or percentage of the battery.

Here, the ceiling calculating unit may calculate the charge ceiling voltage so that a positive electrode full charge potential of the secondary battery is maintained within a predetermined range even though the degradation rate of the secondary battery increases.

In addition, the ceiling calculating unit may calculate the charge ceiling voltage so that the charge ceiling voltage decreases as the degradation rate of the secondary battery increases.

In addition, the ceiling calculating unit may compare a positive electrode full charge reference potential at a current degradation rate with a positive electrode full charge initial potential and calculate the charge ceiling voltage by using the comparison result.

In addition, the memory unit may store the positive electrode full charge initial potential and the positive electrode full charge reference potential at each degradation rate.

In addition, the memory unit may store a positive electrode full charge initial potential, a positive electrode reference potential profile according to a discharge capacity and a full cell reference potential profile according to the discharge capacity at each degradation rate, and the ceiling calculating unit may extract a positive electrode reference potential profile according to the discharge capacity and a full cell reference potential profile according to the discharge capacity corresponding to a current degradation rate, and calculate the charge ceiling voltage based on the extracted positive electrode reference potential profile and the extracted full cell reference potential profile.

In addition, the ceiling calculating unit may calculate a discharge capacity corresponding to the positive electrode full charge initial potential from the extracted positive electrode reference potential profile and calculate a voltage corresponding to the calculated discharge capacity at the extracted full cell reference potential profile as the charge ceiling voltage.

In addition, the battery charging management apparatus may further comprise a voltage measuring unit configured to measure a voltage of the secondary battery, and the charge control unit may control the charging of the secondary battery by comparing the voltage measurement information measured by the voltage measuring unit with the charge ceiling voltage calculated by the ceiling calculating unit.

In addition, in another aspect of the present disclosure, there is also provided a battery pack including the battery charging management apparatus according to the present disclosure.

In addition, in another aspect of the present disclosure, there is also provided a vehicle including the battery charging management apparatus according to the present disclosure.

In another aspect of the present disclosure, there is also provided a secondary battery charging management method, comprising: estimating a degradation rate of a secondary battery; calculating a charge ceiling voltage based on the degradation rate estimated in the degradation rate estimating step; and controlling the charging of the secondary battery so that the secondary battery is charged only up to the charge ceiling voltage calculated in the charge ceiling voltage calculating step.

Advantageous Effects

According to the present disclosure, it is possible to effectively delay the degradation of a secondary battery by controlling the charging of the secondary battery.

Thus, according to the present disclosure, the life span of the secondary battery is improved, thereby promoting the development of a long-life secondary battery.

In particular, according to an aspect of the present disclosure, it is possible to suppress that the degradation of a secondary battery is accelerated due to side reaction between the positive electrode and the electrolyte.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

A battery charging management apparatus according to the present disclosure may be an apparatus for managing the charging of a battery including a secondary battery, such as a battery pack or a battery module. Here, the battery may have one or more secondary batteries.

Figure 1:
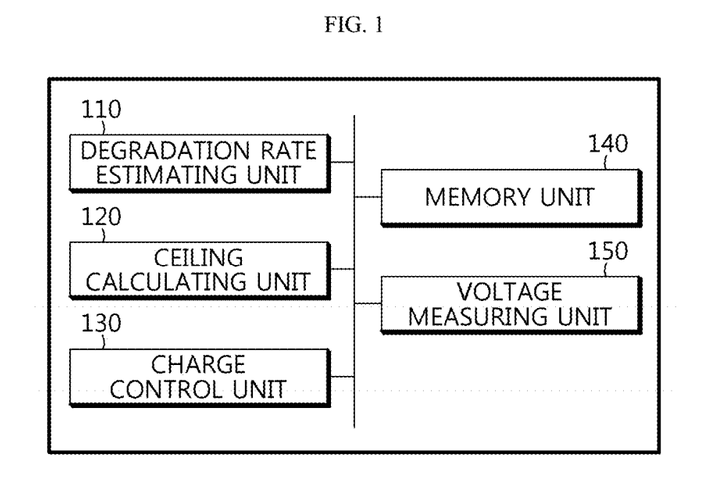
FIG. 1 is a block diagram schematically showing a functional configuration of a battery charging management apparatus according to an embodiment of the present disclosure.

FIG. 1 is a block diagram schematically showing a functional configuration of a battery charging management apparatus according to an embodiment of the present disclosure.

Referring to FIG. 1, the battery charging management apparatus according to the present disclosure may include a degradation rate estimating unit 110, a ceiling calculating unit 120, a charge control unit 130, and a memory unit 140.

The degradation rate estimating unit 110 may estimate a degradation rate of a secondary battery provided at the battery. The initial capacity of the secondary battery at the Beginning Of Life (BOL) may not be maintained as it is, and the capacity may decrease over time. In particular, the capacity of the secondary battery may decrease not only when being charged and discharged but also when being just stored. The decrease of capacity of the secondary battery may be quantitatively calculated as the degradation rate. The degradation rate or degradation degree may be defined by the ratio of capacity reduction in a current state to the capacity in the BOL state.

The degradation rate estimating unit 110 may estimate the degradation rate of the secondary battery in various ways. Typically, the degradation rate estimating unit 110 may estimate the degradation rate of the secondary battery by calculating a capacity reduction. For example, the degradation rate estimating unit 110 may estimate the secondary battery degradation rate by measuring the capacity of the secondary battery and comparing the current measured capacity with the BOL capacity to calculate a difference between the current measured capacity and the BOL capacity. Here, the capacity of the secondary battery may also be measured by the degradation rate estimating unit 110 in various ways. For example, the degradation rate estimating unit 110 may measure the capacity of the secondary battery by fully charging the secondary battery when the secondary battery is completely discharged and accumulating a charging current flowing into the secondary battery during the fully charging process.

Alternatively, the degradation rate estimating unit 110 may estimate the degradation rate of the secondary battery based on degradation degree profile information predetermined according to various operation conditions. For example, the memory unit 140 or the like may define and store a plurality of degradation rate profiles according to various operating conditions of the secondary battery in advance. For example, the memory unit 140 may store a plurality of degradation rate profiles according to a state of charge (SOC), temperature, C-rate, and the like in advance. In this case, the degradation rate estimating unit 110 may extract from the memory unit 140 a degradation rate profile satisfying the condition in which the actual secondary battery actually operates, and estimate the degradation rate of the current secondary battery from the extracted degradation rate profile.

Alternatively, the degradation rate estimating unit 110 may count the number of charging and discharging cycles of the secondary battery and estimate the degradation rate according to the number of charging and discharging cycles. Alternatively, the degradation rate estimating unit 110 may continuously accumulate the charging and discharging current of the battery and estimate the degradation rate according to the magnitude of the accumulated charging and discharging current. Alternatively, the degradation rate estimating unit 110 may measure an internal resistance of the secondary battery and estimate the degradation rate of the secondary battery according to the magnitude of the measured internal resistance.

In addition, the degradation rate estimating unit 110 may estimate the degradation rate of the secondary battery by using various degradation rate estimating methods or a SOH (State Of Health) estimating method, known in the art at the time of filing of this application.

If the degradation rate of the secondary battery is estimated, the degradation rate estimating unit 110 may transmit the estimated degradation rate information to other components of the battery charging management apparatus according to the present disclosure. In particular, the degradation rate estimating unit 110 may transmit the degradation rate estimation information to the ceiling calculating unit 120.

The ceiling calculating unit 120 may receive the degradation rate estimation information from the degradation rate estimating unit 110 and calculate a charge ceiling voltage of the secondary battery or the battery based on the received degradation rate estimation information. That is, the ceiling calculating unit 120 may change the calculation result of the charge ceiling voltage according to the degradation rate of the secondary battery.

For example, when the degradation rate of the secondary battery received from the degradation rate estimating unit 110 is d1, the ceiling calculating unit 120 may calculate the charge ceiling voltage as VL1. In addition, when the degradation rate of the secondary battery received from the degradation rate estimating unit 110 is d2 (d1<d2) after certain time, the ceiling calculating unit 120 may calculate the charge ceiling voltage as VL2 (VL1≠VL2).

If the charge ceiling voltage is calculated as above, the ceiling calculating unit 120 may transmit the information about the calculated charge ceiling voltage to other components of the battery charging management apparatus according to the present disclosure. In particular, the ceiling calculating unit 120 may transmit the charge ceiling voltage information to the charge control unit 130. Also, the ceiling calculating unit 120 may transmit the charge ceiling voltage information to the memory unit 140 so that the value is temporarily or continuously stored. In this case, the ceiling calculating unit 120 may store the charge ceiling voltage information in the memory unit 140 in correspondence with the degradation rate.

The charge control unit 130 may receive charge ceiling voltage information from the ceiling calculating unit 120. In addition, the charge control unit 130 may control the charging of the secondary battery, namely the charging of the battery, according to the received charge ceiling voltage. In particular, the charge control unit 130 may control the charging of the secondary battery so that the secondary battery is charged just to the charge ceiling voltage. That is, the charge control unit 130 may control the charging of the secondary battery so that the voltage of the secondary battery does not exceed the charge ceiling voltage. For example, if the charge ceiling voltage calculated by the ceiling calculating unit 120 is VL1, when the secondary battery is charged, the charge control unit 130 may allow the secondary battery to be charged only up to the voltage VL1.

When the secondary battery is charged, the charge control unit 130 may allow the secondary battery to be charged only up to the charge ceiling voltage in various ways. For example, the charge control unit 130 may allow the secondary battery to be charged with a constant voltage (CV) in accordance with the charge ceiling voltage. Alternatively, when the secondary battery is charged, the charge control unit 130 may shut off a charging switch if the voltage of the secondary battery reaches the charge ceiling voltage, so that the charging current is not supplied to the secondary battery.

The memory unit 140 may store various information required for each component of the battery charging management apparatus according to the present disclosure to perform an operation. That is, the memory unit 140 may store information required for at least one of the degradation rate estimating unit 110, the ceiling calculating unit 120 and the charge control unit 130 to perform the operation. For example, the memory unit 140 may store various program information for the degradation rate estimating unit 110, the ceiling calculating unit 120 and/or the charge control unit 130 to perform an operation. Alternatively, the memory unit 140 may store information about the result of an operation performed by the degradation rate estimating unit 110, the ceiling calculating unit 120 and/or the charge control unit 130. Alternatively, the memory unit 140 may store various reference information required for the degradation rate estimating unit 110, the ceiling calculating unit 120 and/or the charge control unit 130 to perform an operation.

The memory unit 140 may be implemented as at least one of a flash memory type, a hard disk type, a solid state disk (SSD) type, a solid disk drive (SDD) type, a multimedia card micro type, RAM, SRAM, ROM, EEPROM and PROM, but the present disclosure is not necessarily limited to the above specific form of the memory unit 140.

Preferably, the ceiling calculating unit 120 may calculate the charge ceiling voltage so that a positive electrode full charge potential of the secondary battery is maintained within a certain range even though the degradation rate of the secondary battery increases. Here, the positive electrode full charge potential may be regarded as a positive electrode potential when the secondary battery is in a fully charged state, namely when the SOC of the secondary battery is 100%.

Here, the positive electrode potential may be measured or estimated in various ways. For example, if the secondary battery includes a reference electrode terminal in addition to a positive electrode terminal and a negative electrode terminal, a positive electrode potential may be found by measuring a potential difference between the positive electrode terminal and the reference electrode terminal. Alternatively, if the secondary battery does not include a reference electrode terminal, the positive electrode potential may be estimated in many other ways. For example, the positive electrode potential variation profile according to a discharge amount (a discharging capacity compared to the full charge) or the SOC is stored in advance in the memory unit 140, and the positive electrode potential may be estimated for each discharging amount or SOC based on the stored variation profile information.

Meanwhile, the operation for measuring or estimating the positive electrode potential may be performed by the ceiling calculating unit 120 or a voltage measuring unit 150 or the like, explained later.

In general, as the lithium secondary battery degrades, the positive electrode potential may be changed. That is, depending on the degree of degradation of the secondary battery, the positive electrode potential may be different even in the same discharge amount or the same SOC state. This phenomenon will be described in more detail with reference to FIGS. 2 and 3.

Figure 2:
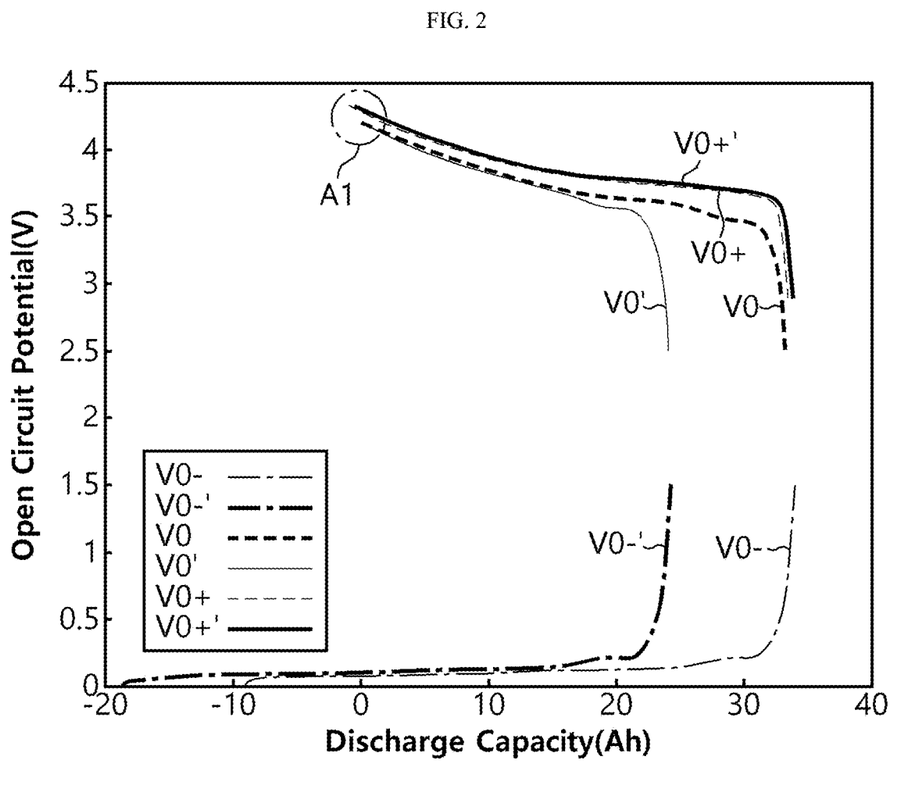
FIG. 2 is a graph showing an example of a potential change of a secondary battery according to degradation, when a conventional battery is charged.

FIG. 2 is a graph showing an example of a potential change of a secondary battery according to degradation, when a conventional battery is charged. The graph of FIG. 2 may be regarded as potential profiles in a state where a balance shift of about 10 Ah occurs. Also, FIG. 3 is an enlarged view showing a portion A1 of FIG. 2.

Figure 3:
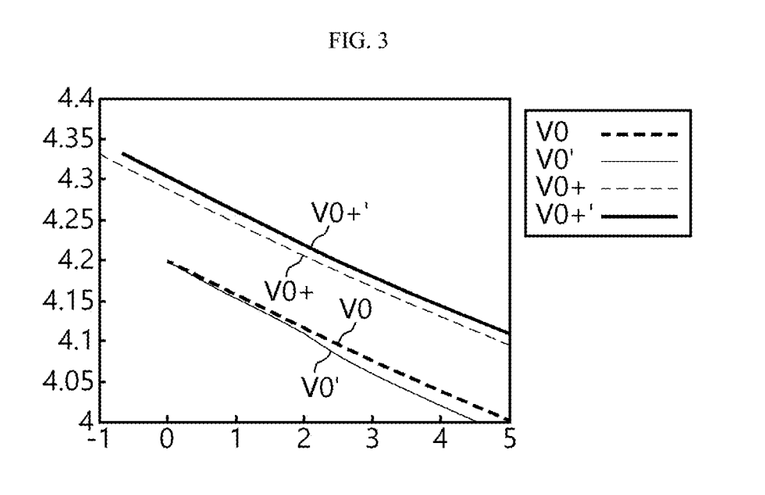
FIG. 3 is an enlarged view showing a portion A1 of FIG. 2.

In FIGS. 2 and 3, a horizontal axis (an x axis) represents a discharge amount of the secondary battery. Since the discharge amount increases in a right direction, the axis may be regarded as corresponding to SOC. That is, it may be regarded that the SOC decreases in a right direction of the horizontal axis. Also, in FIGS. 2 and 3, a vertical axis (a y axis) represents an open circuit potential.

FIGS. 2 and 3 show a positive electrode potential, a negative electrode potential and a full cell potential (voltage) before and after degradation for the secondary battery. That is, each potential before degradation is indicated by a dotted line, and each potential after degradation is indicated by a solid line. In particular, the term "before degradation" may mean an initial state of the battery, namely the BOL state. Here, the full cell potential is represented by the difference between the positive electrode potential and the negative electrode potential, which may be expressed as a full cell voltage, a total voltage or a total potential. More specifically, in FIGS. 2 and 3, the positive electrode potential before degradation is represented by V0+, the positive electrode potential after degradation is represented by V0+', the full cell potential before degradation is represented by V0, and the full cell potential after degradation is represented by V0'. Also, in FIG. 2, the negative electrode potential before degradation is represented by V0−, and the negative electrode potential after degradation is represented by V0−'.

Referring to FIGS. 2 and 3, it may be understood that in case of a typical battery, as the degradation progresses, the positive electrode potential increases and the negative electrode potential and the full cell potential decrease. In addition, it may be understood that the full cell full charge potential is about the same as 4.2V, but after the degradation, the full cell potential is lowered further as the discharge progresses. Also, referring to FIG. 3, it may be understood that the positive electrode potential profile (graph) after degradation is above the positive electrode potential profile (graph) before degradation. Thus, it may be regarded that the positive electrode potential after degradation is larger than the positive electrode potential before degradation, based on the same discharge amount. In particular, the positive electrode potential at a point where the horizontal axis is zero may be regarded as the positive electrode full charge potential, and it may be understood that the positive electrode full charge potential increases as the degradation progresses. Although this increase in the positive electrode full charge potential is not as clearly seen in FIG. 2, it can be clearly seen in the enlarged view of portion A1 of FIG. 2 as shown in FIG. 3. For example, in the graph of FIG. 3, the positive electrode full charge potential is about 4.28V before degradation but is increased to about 4.30V after degradation.

As described above, under the conventional battery charge control conditions, as the degradation progresses, the positive charge full charge potential increases further. However, the battery charging management apparatus according to the present disclosure may allow the positive electrode full charge potential to be maintained within a certain range. In particular, the ceiling calculating unit 120 may allow the positive electrode full charge potential of the secondary battery to be maintained within a certain range without increasing continuously, even though the degradation rate is increased. This configuration of the present invention will be described in more detail with reference to FIGS. 4 to 6.

Figure 4:
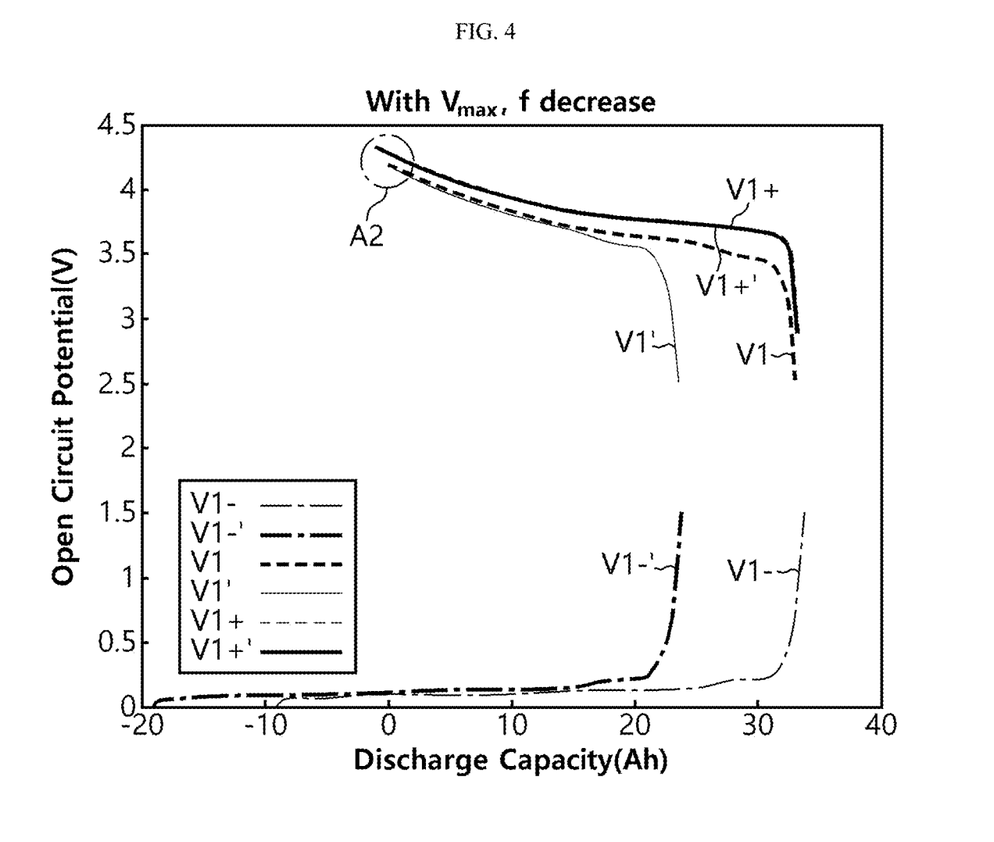
FIG. 4 is a graph showing an example of a potential change of the secondary battery according to degradation, when the charging is controlled using the battery charging management apparatus according to an embodiment of the present disclosure.

FIG. 4 is a graph showing an example of a potential change of the secondary battery according to degradation, when the charging is controlled using the battery charging management apparatus according to an embodiment of the present disclosure. The graph of FIG. 4 may also be regarded as a potential profile in a state where a balance shift of about 10 Ah occurs, similar to FIG. 2. In addition, FIG. 5 is an enlarged view showing a portion A2 of FIG. 4.

Figure 5:
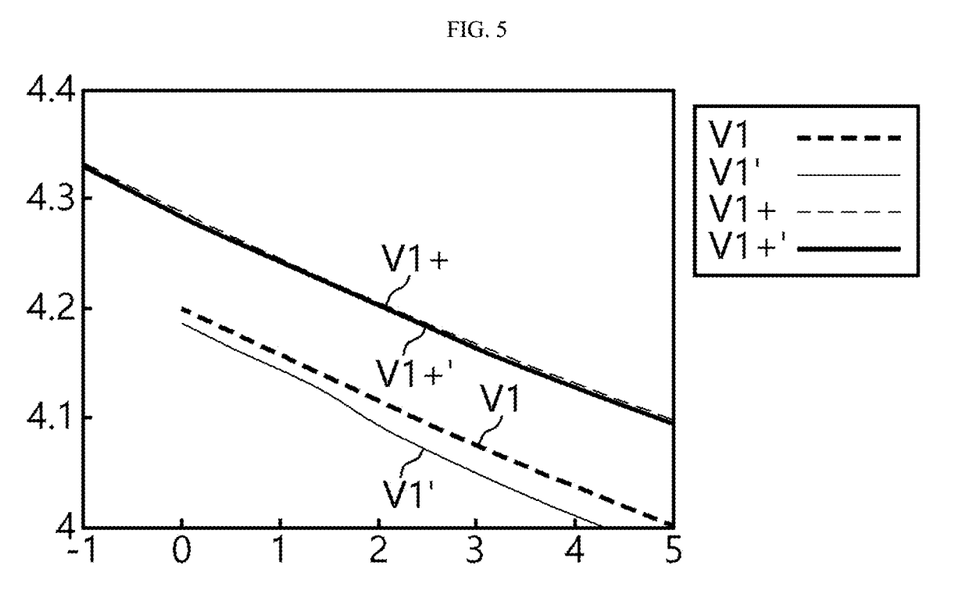
FIG. 5 is an enlarged view showing a portion A2 of FIG. 4.

In FIGS. 4 and 5, the horizontal axis and the vertical axis are formed similar to that of FIGS. 2 and 3. Also, in FIGS. 4 and 5, each potential before degradation is indicated by a dotted line, and each potential after degradation is indicated by a solid line. More specifically, the positive electrode potential before degradation is represented by V1+, the positive electrode potential after degradation is represented by V1+', the full cell potential before degradation is represented by V1, and the full cell potential after degradation is represented by V1'. In addition, in FIGS. 4 and 5, the negative electrode potential before degradation is represented by V1−, and the negative electrode potential after degradation is represented by V1−'. Also, in this case, the term "before degradation" may mean the initial state of the battery, namely the BOL state.

Referring to FIGS. 4 and 5, the positive electrode potential after degradation (V1+') is almost identical to the positive electrode potential before degradation (V1+) such that little to no difference can be seen even in the enlarged view of portion A2 of FIG. 4 as shown in FIG. 5. Further, referring to FIG. 5, even though the secondary battery is degraded, the positive electrode potential profile (graph) after degradation is not higher than the positive electrode potential profile before degradation and is displayed at a similar level of magnitude, different from FIG. 3.

The positive electrode potential profile may have a similar magnitude even after degradation because the positive electrode full charge potential of the secondary battery is maintained within a certain range. For example, even though the degradation progresses, the positive electrode full charge potential may have the same value as the positive full charge potential in the BOL state (or, a reference full charge potential) or have a difference less than 0.1V. More specifically, seeing the graph of FIG. 5, the positive electrode full charge potential is about 4.28 V in the state before degradation, namely in the BOL state, and is about 4.28 V even in the state after degradation.

As described above, the positive electrode full charge potential may be equal to or be maintained within a certain difference from the reference full charge potential, and this configuration may be achieved by controlling the full cell potential during full charge. In particular, in the present disclosure, the ceiling calculating unit 120 calculates the charge ceiling voltage, and at this time, the full cell potential may be controlled at full charge by adjusting the calculated value of the charge ceiling voltage. That is, the ceiling calculating unit 120 may change the calculated value of the charge ceiling voltage according to degradation so that the positive electrode full charge potential of the secondary battery is equal to or within a certain different from the reference full charge potential in the BOL state.

For example, in the graph of FIG. 5, in order to keep the positive electrode full charge potential (V1+') constant at about 4.28V after degradation, the full cell full charge potential (V1') should be reduced from 4.2V to about 4.18V. For this, the ceiling calculating unit 120 may calculate the charge ceiling voltage as about 4.18V. Accordingly, the full cell full charge potential may be 4.18V, and the positive electrode full charge potential may be maintained at about 4.28V, which is similar to that before degradation.

Also preferably, the ceiling calculating unit 120 may calculate the charge ceiling voltage such that the charge ceiling voltage decreases as the degradation rate increases. This will be described in more detail with reference to FIG. 6.

Figure 6:
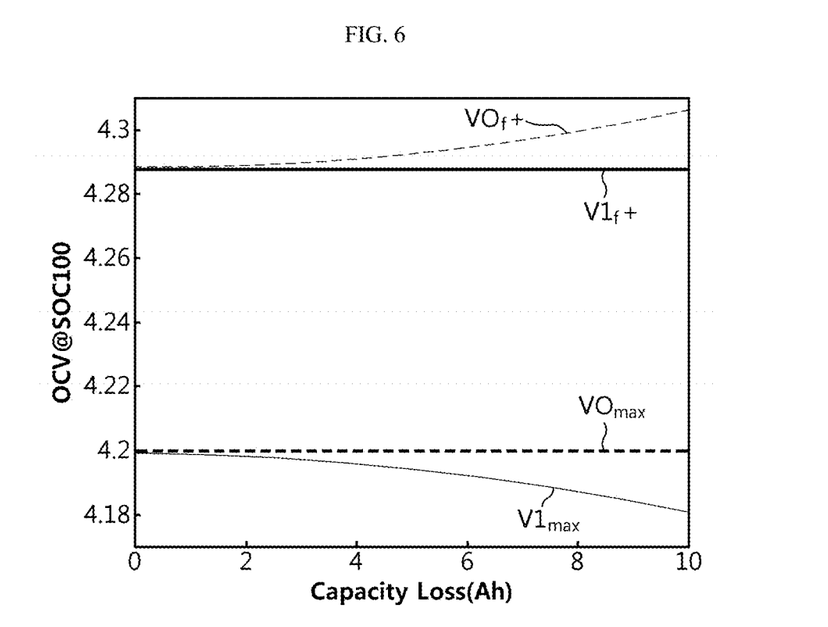
FIG. 6 is a graph schematically showing a magnitude change of a positive electrode full charge potential and a charge ceiling voltage according to a degradation rate, comparatively exhibiting an example according to the present disclosure and a comparative example according to the conventional art.

FIG. 6 is a graph schematically showing a magnitude change of a positive electrode full charge potential and a charge ceiling voltage according to a degradation rate, comparatively exhibiting an example according to the present disclosure and a comparative example according to the conventional art.

In FIG. 6, the horizontal axis may be regarded as representing the degradation rate as a capacity loss, and the vertical axis represents an OCV (Open Circuit Voltage) in a fully charged state (SOC 100%). Also, the dotted line is a graph of a comparative example according to the conventional art, where V0f+ represents a positive electrode full charge potential and V0 max represents a charge ceiling voltage. In addition, the solid line is a graph of an example according to the present disclosure, where V1f+ represents a positive electrode full charge potential and V1 max represents a charge ceiling voltage.

Seeing the dotted line of FIG. 6, if the charge ceiling voltage (V0 max) is maintained constant even though the degradation rate increases, similar to the charge control configuration according to the conventional art, the positive electrode full charge potential (V0f+) may show a pattern of gradually increasing as the degradation rate increases. Meanwhile, as shown by the solid line in FIG. 6, if the charge ceiling voltage (V1 max) is gradually decreased as the degradation rate is increased, according to the charge control configuration of the present disclosure, the positive electrode full charge potential (V1f+) may show a pattern of being maintained constant or being within a certain range even though the degradation progresses. In particular, in the present disclosure, the charge ceiling voltage is calculated by the ceiling calculating unit 120, and, when calculating the charge ceiling voltage, the ceiling calculating unit 120 may gradually decrease the charge ceiling voltage as the degradation rate increases.

Meanwhile, the above configuration may also be clearly understood by comparing the graphs of FIGS. 3 and 5. That is, in the graph of FIG. 3, the charge ceiling voltage is maintained constant before and after degradation, so that the full cell full charge potential is the same as about 4.2V. Meanwhile, in the graph of FIG. 5, the full cell full charge voltage after degradation is lower than the full cell full charge voltage before degradation because the charge ceiling voltage is determined to be low according to degradation by the ceiling calculating unit 120. In addition, due to the drop of the full cell full charge voltage, it may be regarded that the positive electrode full charge potential is measured as similar magnitudes before and after degradation.

Also preferably, the ceiling calculating unit 120 may compare the positive electrode full charge reference potential at a current degradation rate with the positive electrode full charge initial potential for the secondary battery. In addition, the ceiling calculating unit 120 may calculate the charge ceiling voltage by using the comparison result.

Here, the positive electrode full charge reference potential at the current degradation rate may be regarded as a positive electrode full charge potential in a state where the charge ceiling voltage control according to the present disclosure is not performed. In other words, the positive electrode full charge reference potential at the current degradation rate may be regarded as a positive electrode full charge potential that may be formed in the level of the current degradation rate when the full cell full charge potential is maintained constant even though the degradation progresses as in the conventional case. In addition, the positive electrode full charge initial potential may be regarded as a positive electrode full charge potential in a state where the degradation rate of the battery is 0%, namely in the BOL state where the battery is not degraded. For example, if the positive electrode potential after degradation shown in the graph of FIG. 3 is a positive electrode potential at the same degradation rate as the time point to be currently measured, the positive electrode full charge reference potential may be about 4.30V and the positive electrode full charge initial potential may be about 4.28V. In this case, the ceiling calculating unit 120 may calculate the charge ceiling voltage by comparing the positive electrode full charge initial potential of 4.28V with the positive electrode full charge reference potential of 4.30V.

Here, the memory unit 140 may store the positive electrode full charge initial potential and the positive electrode full charge reference potential at each degradation rate. For example, in the graph of FIG. 3, the positive electrode full charge initial potential is 4.28V, and thus the memory unit 140 may store 4.28V as the positive electrode full charge initial potential value. In addition, the memory unit 140 may store the positive electrode full charge reference potential at each degradation rate. For example, when the degradation rate of the secondary battery is 10%, 20%, 30%, 40%, . . . , the memory unit 140 may store a corresponding positive full charge reference potential at each degradation rate. As a more specific example, the memory unit 140 may store the positive electrode full charge reference potential when the degradation rate of the secondary battery is 10%, 20%, 30%, 40%, . . . , as 4.29V, 4.30V, 4.31V, 4.32V, . . . , respectively. In this case, the ceiling calculating unit 120 may receive the information about the degradation rate of the secondary battery by the degradation rate estimating unit 110 and read a corresponding positive electrode full charge reference potential according to the received degradation rate information from the memory unit 140.

Also preferably, the memory unit 140 may store the positive electrode full charge initial potential, the positive electrode reference potential profile according to a discharge capacity and the full cell reference potential profile according to the discharge capacity at each degradation rate.

Here, the positive electrode reference potential may be a positive electrode potential that may be formed when the charge control according to the present disclosure is not performed, as described above. That is, in the present disclosure, the charge ceiling voltage may be changed as the degradation progresses, but the positive electrode reference potential may be a positive electrode potential that appears when the charge ceiling voltage is maintained constant without being changed. In addition, the positive electrode reference potential profile according to the discharge capacity may indicate a pattern in which the positive electrode reference potential changes as the discharge capacity changes, namely as the SOC changes. The positive electrode reference potential profile according to the discharge capacity may be expressed in the form of a curve or a straight line. For example, the positive electrode potential (V+') graph after degradation in FIG. 3 may be regarded as one positive electrode reference potential profile.

Figure 7:
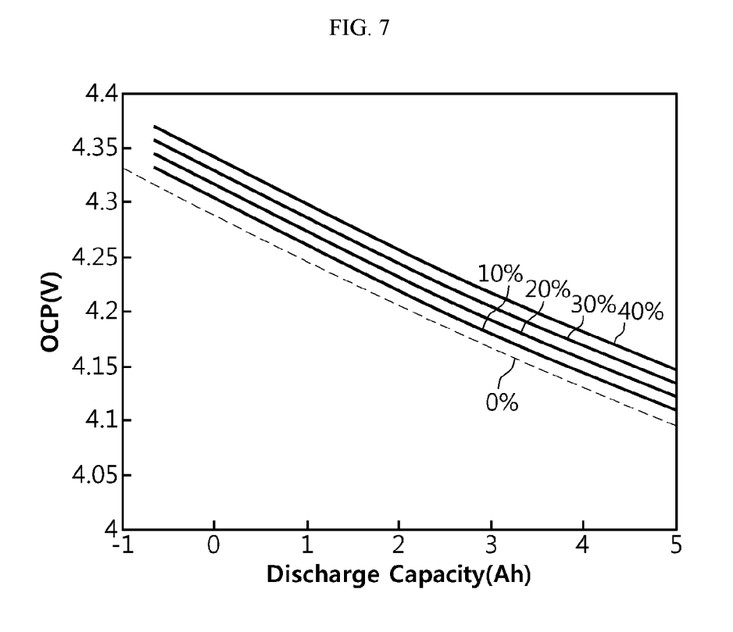
FIG. 7 is a graph schematically showing that a memory unit according to an embodiment of the present disclosure stores a full cell reference potential profile according to a discharge capacity for several degradation rates.

The memory unit 140 may store the positive electrode reference potential profile according to a discharge capacity at each degradation rate of the secondary battery. FIG. 7 is a graph schematically showing that the memory unit 140 according to an embodiment of the present disclosure stores a full cell reference potential profile according to a discharge capacity for several degradation rates. In FIG. 7, a numeral in each graph represents a degradation rate of the secondary battery.

Referring to FIG. 7, the memory unit 140 may store the discharge capacity-positive electrode reference potential profile corresponding to each degradation rate in advance whenever the degradation rate of the secondary battery is 0%, 10%, 20%, 30%, 40% . . . . For example, the graph of the positive electrode potential (V0+') after degradation in FIG. 3 may be a positive electrode reference potential profile according to the discharge capacity corresponding to any one degradation rate. In addition, the memory unit 140 may store the graph in different forms for various degradation rates.

The positive electrode reference potential profile according to the discharge capacity for each degradation rate may be experimentally measured at each degradation rate and stored in the memory unit 140 in advance.

In addition, the full cell reference potential may be a full cell potential that may be formed when the charge control of the present disclosure is not performed. That is, the full cell reference potential may be a full cell potential that is found when the charge ceiling voltage is maintained constant despite the change of the degradation rate, namely when the full cell full charge voltage is maintained constant. In addition, the full cell reference potential profile according to the discharge capacity may show the form that the full cell reference potential changes as the discharge capacity changes. This full cell reference potential profile according to the discharge capacity may also be expressed in the form of a curve or a straight line. For example, the graph of the full cell potential (V0') after degradation as depicted in FIG. 3 may be a full cell reference potential profile.

In particular, the memory unit 140 may store the full cell reference potential profile according to the discharge capacity for each degradation rate of the secondary battery.

Figure 8:
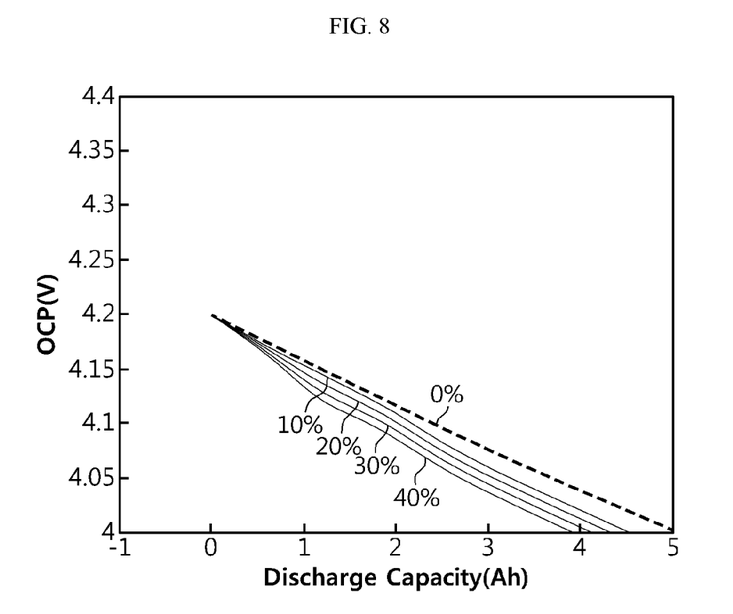
FIG. 8 is a graph schematically showing that the memory unit according to an embodiment of the present disclosure stores a full cell reference potential profile according to a discharge capacity for several degradation rates.

FIG. 8 is a graph schematically showing that the memory unit 140 according to an embodiment of the present disclosure stores a full cell reference potential profile according to a discharge capacity for several degradation rates. In FIG. 8, a numeral in each graph represents a degradation rate of the secondary battery.

Referring to FIG. 8, the memory unit 140 may store the discharge capacity-full cell reference potential profile corresponding to each degradation rate in advance whenever the degradation rate of the secondary battery is 0%, 10%, 20%, 30%, 40%, . . . . For example, the graph of full cell potential (V0') after degradation in FIG. 3 may be a full cell reference potential profile according to the discharge capacity corresponding to any one degradation rate. In addition, the memory unit 140 may store the graphs in different forms for various degradation rates.

The full cell reference potential profile according to the discharge capacity for each degradation rate may be experimentally measured at each degradation rate and stored in the memory unit 140 in advance.

In this configuration, the ceiling calculating unit 120 may extract profiles corresponding to the current degradation rate among a plurality of positive electrode reference potential profiles and a plurality of full cell reference potential profiles stored in the memory unit 140. That is, if the degradation rate estimating unit 110 estimates the degradation rate of the secondary battery, the ceiling calculating unit 120 may receive the degradation rate estimation information from the degradation rate estimating unit 110. In addition, the ceiling calculating unit 120 may extract a discharge capacity-positive electrode reference potential profile and a discharge capacity-full cell reference potential profile corresponding thereto based on the received degradation rate estimation information.

For example, if the positive electrode reference potential profile is stored in the memory unit 140 for each the degradation rate as shown in FIG. 7 and the full cell reference potential profile is stored in the memory unit 140 for each degradation rate as shown in FIG. 8, the ceiling calculating unit 120 may select any one positive electrode reference potential profile from the graph of FIG. 7 and select any one full cell reference potential profile from the graph of FIG. 8. More specifically, if the degradation rate estimating unit 110 estimates that the current degradation rate of the secondary battery is 10%, the ceiling calculating unit 120 may select the graphs corresponding to the degradation rate in FIGS. 7 and 8, namely the graphs indicated by 10%, as the positive electrode reference potential profile and the full cell reference potential profile.

In addition, the ceiling calculating unit 120 may calculate the charge ceiling voltage using the extracted reference profile. That is, if any one positive electrode reference potential profile and any one full cell reference potential profile are extracted, the ceiling calculating unit 120 may calculate the charge ceiling voltage based on the extracted positive electrode reference potential profile and the extracted full cell reference potential profile. For example, if the reference potential profile corresponding to a 10% degradation rate is respectively extracted from the graphs of FIGS. 7 and 8 as in the embodiment, the ceiling calculating unit 120 may calculate the charge ceiling voltage by using the reference potential profiles corresponding to the 10% degradation rate.

Here, the ceiling calculating unit 120 may calculate the discharge capacity corresponding to the positive electrode full charge initial potential in the extracted positive electrode reference potential profile. In addition, the ceiling calculating unit 120 may calculate the voltage corresponding to the calculated discharge capacity in the extracted full cell reference potential profile as the charge ceiling voltage. This will be described in more detail with reference to FIG. 9.

Figure 9:
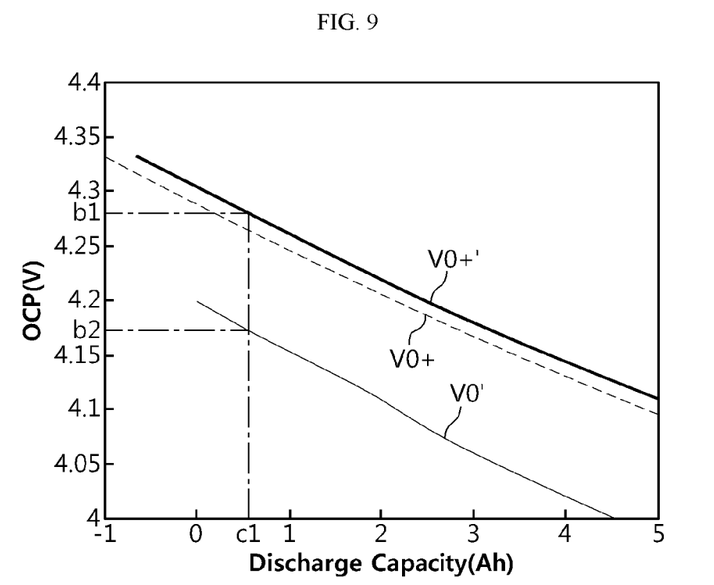
FIG. 9 is a diagram schematically showing a configuration for calculating a charge ceiling voltage according to an embodiment of the present disclosure.

FIG. 9 is a diagram schematically showing a configuration for calculating a charge ceiling voltage according to an embodiment of the present disclosure. In FIG. 9, V0+ may represent a positive electrode reference potential profile before degradation, V0+' may represent a positive electrode reference potential profile extracted from the memory unit 140 in correspondence with the current degradation rate, and V0' may represent a full cell reference potential profile extracted from the memory unit 140 in correspondence with the current degradation rate.

The ceiling calculating unit 120 may check the positive electrode full charge initial potential in the positive electrode reference potential profile (V0+) before degradation. That is, the ceiling calculating unit 120 may extract a potential value when the discharge capacity is 0 (SOC 100%), in the V0+ graph of FIG. 9. Referring to FIG. 9, the positive electrode full charge initial potential may be checked to be about 4.286 V as b1.

Even though it is explained in this embodiment that the memory unit 140 stores the positive electrode reference potential profile before degradation and the ceiling calculating unit 120 checks the positive electrode full charge initial potential from the profile, it is also possible that the memory unit 140 directly stores the positive electrode full charge initial potential. For example, the memory unit 140 may directly store 4.286V as the positive electrode full charge initial potential. In this case, the ceiling calculating unit 120 may use the positive electrode full charge initial potential stored in the memory unit 140 as described above.

Meanwhile, if the positive electrode full charge initial potential is figured out as above, the ceiling calculating unit 120 may calculate the discharge capacity (SOC) corresponding to the positive electrode full charge initial potential from the extracted positive electrode reference potential profile. For example, in the embodiment of FIG. 9, if the discharge capacity corresponding to the positive electrode full charge initial potential of 4.286V (b1) is found in the V0+' graph, it may be c1, which corresponds to about 0.45 Ah. That is, the ceiling calculating unit 120 may calculate the discharge capacity corresponding to the positive electrode full charge initial potential as 0.45 Ah.

In addition, the ceiling calculating unit 120 may calculate the voltage corresponding to the calculated discharge capacity in the extracted full cell reference potential profile as the charge ceiling voltage. For example, in the embodiment of FIG. 9, since the extracted full cell reference potential profile is the V0' graph and the calculated discharge capacity is 0.45 Ah (c1), the full cell potential corresponding to 0.45 Ah in the V0' graph may be calculated as the charge ceiling voltage. Referring to FIG. 9, the full cell potential corresponding to 0.45 Ah may be b2, which corresponds to about 4.175V. Thus, the ceiling calculating unit 120 may calculate the charge ceiling voltage at the current degradation rate as 4.175V.

Even though it is explained in the embodiment of FIG. 9 that the charge ceiling voltage is calculated using the positive electrode reference potential profile extracted corresponding to the current degradation rate and the full cell reference potential profile extracted corresponding to the current degradation rate, the present disclosure is not necessarily limited to the embodiment.

For example, the ceiling calculating unit 120 may calculate the charge ceiling voltage by using the positive electrode full charge initial potential, the positive electrode full charge reference potential at the current degradation rate, and the full cell full charge initial potential. Here, full cell full charge initial potential may be a full cell full charge potential when SOC is 100% in the secondary battery before degradation.

For example, the memory unit 140 may store the positive electrode full charge initial potential, namely the positive electrode potential when the SOC is 100% in the BOL state where degradation is not progressed. Also, the memory unit 140 may store the positive electrode full charge reference potentials corresponding to various degradation rates, respectively. In addition, the memory unit 140 may store the full cell full charge initial potential.

More specifically, the memory unit 140 may store the positive electrode full charge initial potential as 4.28V in advance. Also, when the degradation rate is 10%, 20%, 30%, 40%%, . . . , the memory unit 140 may store the positive electrode full charge reference potential as 4.29V, 4.30V, 4.31V, 4.32V, respectively. In addition, the memory unit 140 may store 4.2V as the full cell full charge initial potential.

In this case, the ceiling calculating unit 120 may extract the positive electrode full charge initial potential and the positive electrode full charge reference potential at the current degradation rate from the memory unit 140. In addition, the ceiling calculating unit 120 may calculate a difference between the positive electrode full charge reference potential at the current degradation rate and the positive electrode full charge initial potential. Also, the ceiling calculating unit 120 may calculate the charge ceiling voltage by subtracting the difference from the full cell full charge initial potential. For example, when the current degradation rate is 10%, the ceiling calculating unit 120 may extract 4.30V as the positive electrode full charge reference potential corresponding to the 10% degradation rate and read the positive electrode full charge initial potential as 4.28V. In addition, the ceiling calculating unit 120 may subtract 0.02V, which is the difference between 4.30V and 4.28V, from the full cell full charge reference voltage of 4.2V. In this case, the ceiling calculating unit 120 may calculate the charge ceiling voltage as 4.18V (4.2V−0.02V).

According to the embodiment of the present disclosure, the configuration for calculating the charge ceiling voltage may be simplified. Thus, the amount of data stored in the memory unit 140 for calculating the charge ceiling voltage may be reduced, and the load, calculation operation time and power of the charge ceiling calculating unit may be reduced.

The battery charging management apparatus according to the present disclosure may further include a voltage measuring unit 150 as shown in FIG. 1.

The voltage measuring unit 150 may measure a voltage of the secondary battery provided in the battery. That is, the voltage measuring unit 150 may be connected to both ends of the secondary battery to measure the voltage at both ends of the secondary battery. In particular, if the battery includes a plurality of secondary batteries, the voltage measuring unit 150 may measure the voltage at both ends of the entire secondary battery assembly. Also, in this case, the voltage measuring unit 150 may measure the voltage at both ends of some secondary batteries, for example each secondary battery.

The voltage measuring unit 150 may be electrically connected to other components of the battery charging management apparatus to exchange electrical signals. In particular, the voltage measuring unit 150 may transmit the voltage measurement information of the secondary battery to the charge control unit 130 so that the voltage measurement information may be used for the operation of the charge control unit 130. Also, the voltage measuring unit 150 may transmit the measured voltage information to the memory unit 140 and to be stored. The voltage measuring unit 150 may be implemented using a voltage measuring circuit or device commonly used in the art, and the present disclosure is not limited to any specific embodiment of the voltage measuring unit 150.

In this configuration, the charge control unit 130 may receive voltage measurement information from the voltage measuring unit 150. Also, the charge control unit 130 may receive the charge ceiling voltage calculated by the ceiling calculating unit 120. In addition, the charge control unit 130 may control the charging of the secondary battery by comparing the voltage measurement information measured by the voltage measuring unit 150 with the charge ceiling voltage calculated by the ceiling calculating unit 120. In particular, the charge control unit 130 may control the charging of the secondary battery so that the voltage measured by the voltage measuring unit 150 does not exceed the charge ceiling voltage. For example, the charge control unit 130 may prevent the voltage of the secondary battery from exceeding the charge ceiling voltage through CV charging. Alternatively, if the voltage of the secondary battery reaches the charge ceiling voltage, the charge control unit 130 may stop charging the secondary battery, for example, by shutting off a charging switch provided in a charging path of the secondary battery.

As described above, according to an embodiment of the present disclosure, as the secondary battery degrades, the charge ceiling voltage suitable for the degradation may be separately determined. In particular, as the secondary battery degrades, the charge ceiling voltage may gradually decrease. In addition, if the charge ceiling voltage is adjusted according to the degradation rate, the life span of the secondary battery may be further increased. Moreover, in the present disclosure, it is possible to prevent the positive electrode from moving gradually to a high voltage region as the secondary battery degrades. Thus, according to the embodiment of the present disclosure, it is possible to prevent the side reaction, namely the oxidation reaction, from accelerating between the positive electrode and the electrolyte. Thus, the degradation of the secondary battery may be effectively delayed, thereby improving the life span of the secondary battery.

Meanwhile, according to the present disclosure, since the full charge voltage is limited to prevent or restrain life degradation, a capacity loss may occur at an initial stage. However, the capacity loss caused by limiting the full charge voltage may not be large. For example, if a secondary battery having an initial capacity of 32 Ah is degraded to have a capacity of 22 Ah, the capacity loss caused by limiting the full charge voltage may be about 0.35 Ah. This is about 1.6% of the total capacity, which is very insignificant. Meanwhile, as the full charge voltage is limited limit according to the present disclosure, the capacity decrease rate of the secondary battery is greatly reduced, thereby increasing the life span the secondary battery eventually in the present disclosure.

In order to implement various control logics, at least at part of components included in the battery charging management apparatus according to the present disclosure, for example the degradation rate estimating unit 110, the ceiling calculating unit 120 and the like, may selectively include processors, application-specific integrated circuits (ASICs), other chipsets, logic circuits, registers, communication modems, data processors, and the like. In addition, when the control logic is implemented by software, the control unit may be implemented by a set of program modules. In this case, the program modules may be stored in a memory and executed by a processor. The memory may be provided inside or outside the processor, and may be connected to the processor by well-known various methods. In addition, the memory may be included in the memory unit 140 of the present disclosure. Also, the memory collectively refers to a device configured to store information regardless of the type of a device, and does not refer to a specific memory device.

The battery charging management apparatus according to the present disclosure may be applied to a battery pack. That is, the battery pack according to the present disclosure may include the battery charging management apparatus described above. In this case, at least some of the degradation rate estimating unit 110, the ceiling calculating unit 120, the charge control unit 130, the memory unit 140 and the voltage measuring unit 150 may be implemented by components already included in the battery pack. For example, the battery pack may include a battery management system (BMS) for managing charge and discharge of the battery pack, and at least some of the degradation rate estimating unit 110, the ceiling calculating unit 120, the charge control unit 130, the memory unit 140 and the voltage measuring unit 150 may be implemented by the BMS.

In addition, a vehicle according to the present disclosure may include the battery charging management apparatus according to the present disclosure described above. In this case, the battery charging management apparatus may be included in a battery pack. Alternatively, at least some components of the battery charging management apparatus may be implemented by another device provided outside the battery pack, in particular a device provided in the vehicle. Here, the vehicle may be an electric vehicle, and the electric vehicle may include all concepts of EV (Electric Vehicle), HEV (Hybrid Electric Vehicle), and PHEV (Plug-in Hybrid Electric Vehicle).

Also, the battery charging management apparatus according to the present disclosure may be applied to various other devices driven by various electric sources other than the vehicle. For example, the battery charging management apparatus according to the present disclosure may be applied to electric trains, electric ships, electric planes, power tools, power storage devices and the like in various ways.

Figure 10:
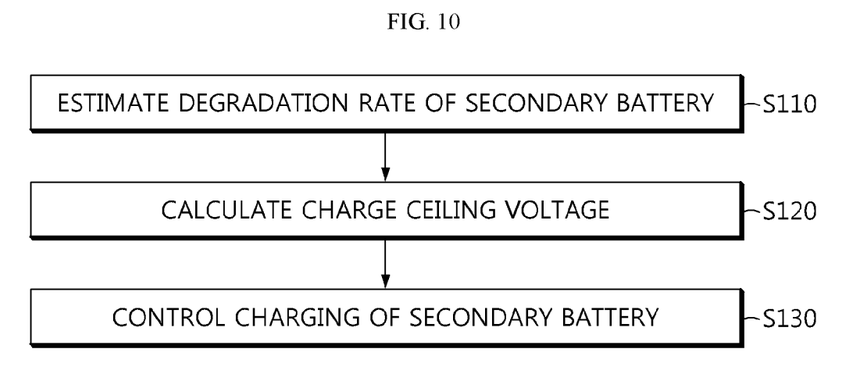
FIG. 10 is a flowchart for schematically illustrating a battery charging management method according to an embodiment of the present disclosure.

FIG. 10 is a flowchart for schematically illustrating a battery charging management method according to an embodiment of the present disclosure. In FIG. 10, a subject of each step may be each component of the battery charging management apparatus described above.

As shown in FIG. 10, if the battery charging management method according to the present disclosure is used, first, a degradation rate of the secondary battery is estimated (S110). Next, the charge ceiling voltage is calculated based on the degradation rate estimated in Step S110 (S120). After that, the charging of the secondary battery is controlled so that charging is performed only up to the charge ceiling voltage calculated in Step S120 (S130).

Preferably, in Step S120, the charge ceiling voltage may be calculated to maintain the positive electrode full charge potential of the secondary battery within a certain range even though the degradation rate of the secondary battery increases.

Also, in Step S120, the charge ceiling voltage may be calculated to gradually decrease as the degradation rate of the secondary battery increases.

Also, in Step S120, the positive electrode full charge reference potential at the current degradation rate may be compared with the positive electrode full charge initial potential, and the charge ceiling voltage may be calculated using the comparison result.

In this case, though not shown in the figures, a process of storing the positive electrode full charge initial potential and the positive electrode full charge reference potential at each degradation rate in the memory unit 140 in advance may be further included. For example, before Step S110, a step of experimentally measuring the positive electrode full charge initial potential and the positive electrode full charge reference potential at each degradation rate for the secondary battery and then storing the measured result in the memory unit 140 may be further performed.

In addition, before Step S110, the battery charging management method according to the present disclosure may further include a step of storing the positive electrode full charge initial potential, the full electrode reference potential profile according to the discharge capacity at each degradation rate, and the full cell reference potential profile according to the discharge capacity in the memory unit 140.

In this case, in Step S120, the positive electrode reference potential profile according to the discharge capacity and the full cell reference potential profile according to the discharge capacity corresponding to the current degradation rate may be extracted, and the charge ceiling voltage may be calculated based on the extracted positive electrode reference potential profile and the extracted full cell reference potential profile.

More preferably, in Step S120, the discharge capacity corresponding to the positive electrode full charge initial potential may be calculated from the extracted positive electrode reference potential profile, and the voltage corresponding to the calculated discharge capacity in the extracted full cell reference potential profile may be calculated as the charge ceiling voltage.

Also, before Step S130, the battery charging management method according to the present disclosure may further include a step of measuring a voltage of the secondary battery. In this case, in Step S130, the charging of the secondary battery may be controlled by comparing the voltage measurement information measured in the voltage measuring step with the charge ceiling voltage calculated in Step S120.

In the present specification, the term "unit" is used such as a 'degradation rate estimating unit', a 'ceiling calculating unit', a 'charge control unit', a 'memory unit', a 'voltage measuring unit', and the like, but these components should be understood as being not necessarily physically distinguished from each other but functionally distinguished from each other. Thus, each component may be selectively integrated with another component, or each component may be divided into sub-components for efficiently executing control logic(s). In addition, even though components are integrated or divided, it should be understood that the integrated or divided components are also within the scope of the present application as long as the identities of the functions may acknowledged.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

110: degradation rate estimating unit
120: ceiling calculating unit
130: charge control unit
140: memory unit
150: voltage measuring unit

What is claimed is:

1. A battery charging management apparatus, comprising:
   a degradation ratio estimating unit configured to estimate a degradation ratio of a secondary battery;
   a ceiling calculating unit configured to calculate a charge ceiling voltage based on the degradation ratio estimated by the degradation ratio estimating unit;
   a charge control unit configured to control the charging of the secondary battery so that the secondary battery is charged only up to the charge ceiling voltage calculated by the ceiling calculating unit; and
   a memory unit configured to store a plurality of positive electrode reference potential profiles according to a discharge capacity and a plurality of full cell reference potential profiles according to the discharge capacity respectively corresponding to a plurality of degradation ratios,
   wherein the ceiling calculating unit is further configured to:
     select one of the positive electrode reference potential profiles and one of the full cell reference potential profiles corresponding to a current degradation ratio; and
     calculate the charge ceiling voltage based on the selected one of the positive electrode reference potential profiles and the selected one of the full cell reference potential profiles.

2. The battery charging management apparatus according to claim 1, wherein the ceiling calculating unit is further configured to calculate the charge ceiling voltage so that a positive electrode full charge potential of the secondary battery is maintained within a predetermined range of a positive electrode full charge initial potential even though the degradation ratio of the secondary battery increases.

3. The battery charging management apparatus according to claim 1, wherein the ceiling calculating unit is further configured to calculate the charge ceiling voltage so that the charge ceiling voltage decreases as the degradation ratio of the secondary battery increases.

4. The battery charging management apparatus according to claim 1, wherein the ceiling calculating unit is further configured to:
   compare a positive electrode full charge reference potential at the current degradation ratio with a positive electrode full charge initial potential; and
   calculate the charge ceiling voltage by using the comparison result.

5. The battery charging management apparatus according to claim 1, wherein:
   the memory unit is further configured to store a positive electrode full charge initial potential, and
   the ceiling calculating unit is further configured to calculate the charge ceiling voltage based on the positive electrode full charge initial potential, the selected one of the positive electrode reference potential profiles, and the selected one of the full cell reference potential profiles.

6. The battery charging management apparatus according to claim 5, wherein the ceiling calculating unit is further configured to:
   calculate a discharge capacity corresponding to the positive electrode full charge initial potential from the selected one of the positive electrode reference potential profiles; and calculate a voltage corresponding to the calculated discharge capacity at the selected one of the full cell reference potential profiles as the charge ceiling voltage.

7. The battery charging management apparatus according to claim 1, further comprising:
a voltage measuring unit configured to measure a voltage of the secondary battery,
wherein the charge control unit is further configured to control the charging of the secondary battery by comparing the voltage measurement information measured by the voltage measuring unit with the charge ceiling voltage calculated by the ceiling calculating unit.

8. A battery pack, comprising the battery charging management apparatus according to claim 1.

9. A vehicle, comprising the battery charging management apparatus according to claim 1.

10. A battery charging management method, comprising:
storing, for a secondary battery, a plurality of positive electrode reference potential profiles according to a discharge capacity and a plurality of full cell reference potential profiles according to the discharge capacity respectively corresponding to a plurality of degradation ratios;
estimating a degradation ratio of the secondary battery;
calculating a charge ceiling voltage based on the degradation ratio estimated in the degradation ratio estimating step; and
controlling the charging of the secondary battery so that the secondary battery is charged only up to the charge ceiling voltage calculated in the charge ceiling voltage calculating step,
wherein the calculating of the charge ceiling voltage includes:
selecting one of the positive electrode reference potential profiles and one of the full cell reference potential profiles corresponding to a current degradation ratio; and
calculating the charge ceiling voltage based on the selected one of the positive electrode reference potential profiles and the selected one of the full cell reference potential profiles.

11. The battery charging management method of claim 10, wherein the calculating of the charge ceiling voltage includes calculating the charge ceiling voltage so that a positive electrode full charge potential of the secondary battery is maintained within a predetermined range of a positive electrode full charge initial potential even though the degradation ratio of the secondary battery increases.

12. The battery charging management method of claim 10, wherein the calculating of the charge ceiling voltage includes calculating the charge ceiling voltage so that the charge ceiling voltage decreases as the degradation ratio of the secondary battery increases.

13. The battery charging management method of claim 10, further comprising storing a positive electrode full charge initial potential,
wherein the calculating of the charge ceiling voltage includes calculating the charge ceiling voltage based on the positive electrode full charge initial potential, the selected one of the positive electrode reference potential profiles, and the selected one of the full cell reference potential profiles.

14. The battery charging management method of claim 13, wherein the calculating of the charge ceiling voltage includes:
calculating a discharge capacity corresponding to the positive electrode full charge initial potential from the selected one of the positive electrode reference potential profiles; and
calculating a voltage corresponding to the calculated discharge capacity at the selected one of the full cell reference potential profiles as the charge ceiling voltage.

15. The battery charging management method of claim 10, further comprising:
measuring a voltage of the secondary battery,
wherein the controlling of the charging of the secondary battery includes controlling the charging of the secondary battery by comparing the measured voltage of the secondary battery with the calculated charge ceiling voltage.

16. A battery charging management apparatus, comprising:
a degradation ratio estimating circuit configured to estimate a current degradation ratio of a secondary battery;
a ceiling calculating circuit configured to calculate a charge ceiling voltage based on the current degradation ratio estimated by the degradation ratio estimating circuit;
a charge control circuit configured to control charging of the secondary battery so that the secondary battery is charged only up to the charge ceiling voltage calculated by the ceiling calculating circuit; and
a memory configured to store a positive electrode full charge initial potential, a full cell full charge initial potential, and a plurality of positive electrode reference potentials respectively corresponding to a plurality of degradation ratios,
wherein the ceiling calculating circuit is further configured to:
select one of the positive electrode reference potentials corresponding to the current degradation ratio; and
calculate the charge ceiling voltage based on the positive electrode full charge initial potential, the full cell full charge initial potential, and the selected one of the positive electrode reference potentials.

17. The battery charging management apparatus according to claim 16, wherein the ceiling calculating circuit is further configured to calculate the charge ceiling voltage so that, higher the current degradation ratio:
higher the selected one of the positive electrode reference potentials, and
lower the calculated charge ceiling voltage.

18. The battery charging management apparatus of claim 16, wherein the ceiling calculating circuit is further configured to:
calculate a difference between the positive electrode full charge initial potential and the selected one of the positive electrode reference potentials; and
subtract the calculated difference from the full cell full charge initial potential to calculate the charge ceiling voltage.

19. The battery charging management apparatus of claim 16, wherein the positive electrode full charge initial potential is a positive electrode full charge potential at a beginning of life (BOL) state, and
wherein the full cell full charge initial potential is a full cell full charge potential at the BOL state.

20. A battery pack, comprising the battery charging management apparatus according to claim 16.

* * * * *